(12) United States Patent
Stewart et al.

(10) Patent No.: US 6,873,746 B2
(45) Date of Patent: Mar. 29, 2005

(54) APPARATUS AND METHOD FOR MONITORING A CABLE

(75) Inventors: Andrew H. Stewart, Fort Collins, CO (US); K. Arun Pandey, Fort Collins, CO (US); Glenn M. Light, San Antonio, TX (US); Richard F. Tennis, San Antonio, TX (US); Bernard A. Clairmont, Adams, MA (US); Edward A. Bloom, San Antonio, TX (US); Keith A. Bartels, San Antonio, TX (US)

(73) Assignee: Electric Power Research Institute, Inc., Palo Alto, CA (US)

( * ) Notice: Subject to any disclaimer, the term of this patent is extended or adjusted under 35 U.S.C. 154(b) by 591 days.

(21) Appl. No.: 09/923,256

(22) Filed: Aug. 2, 2001

(65) Prior Publication Data

US 2003/0026499 A1 Feb. 6, 2003

(51) Int. Cl.[7] .............................. G06K 9/36; G01L 1/26
(52) U.S. Cl. ................................. 382/291; 73/862.391
(58) Field of Search ................................. 382/291, 312, 382/305; 73/862.391, 594; 324/534–536, 500; 340/854.9, 657, 870.04

(56) References Cited

U.S. PATENT DOCUMENTS

| 4,671,654 | A | * | 6/1987 | Miyahara et al. | 356/139.06 |
|---|---|---|---|---|---|
| 4,818,990 | A | | 4/1989 | Fernandes | 340/870.07 |
| 4,904,996 | A | | 2/1990 | Fernandes | 340/870.07 |
| 5,341,088 | A | | 8/1994 | Davis | 324/106 |
| 5,517,864 | A | * | 5/1996 | Seppa | 73/862.391 |
| 5,918,288 | A | * | 6/1999 | Seppa | 73/862.391 |
| 6,097,298 | A | | 8/2000 | Brown | 340/657 |
| 6,205,867 | B1 | * | 3/2001 | Hayes et al. | 73/862.391 |
| 6,229,451 | B1 | * | 5/2001 | Brown | 340/657 |
| 6,240,783 | B1 | * | 6/2001 | McGugin et al. | 73/594 |

OTHER PUBLICATIONS

Kondziolka et al., "Keeping an Eye On Conductor Sag," *Transmission and Distribution World*, pp. 42–48 (Feb. 1999).

"Transmission Line Clearance Monitor," *Ontario Hydro Technologies*, Toronto, Ontario (Mar. 1997).

"CAT–1 Transmission Line Monitoring System," *The Valley Group, Inc.*

* cited by examiner

Primary Examiner—Kanjibhai Patel
(74) Attorney, Agent, or Firm—Morgan, Lewis & Bockius, LLP

(57) ABSTRACT

In one embodiment the present invention provides a device for monitoring a cable, comprising an imaging device having a field of view; a target, distinguishable within the field of view of the imaging device, associated with a cable; and a computer processor connected to the imaging device for analyzing images of the target produced by the imaging device to determine a position of the cable. In another embodiment, the present invention provides a method for monitoring a cable, comprising calibrating a first image of a predetermined field of view showing a portion of a cable to be monitored; capturing a second image of the predetermined field of view; correlating the first image with the second image to determine a position of the portion of the cable within the second image; and reporting said position.

41 Claims, 6 Drawing Sheets

US 6,873,746 B2

APPARATUS AND METHOD FOR MONITORING A CABLE

BACKGROUND OF THE INVENTION

1. Field of the Invention

The invention relates generally to monitoring a cable, such as an overhead power line or a transmission or distribution line. More specifically, the invention is directed to monitoring the position of a cable relative to a fixed reference point or a change in such position.

2. Description of Related Art

Transmission and distribution lines, overhead conductors, or overhead power lines that are used to transmit electrical power are designed to be within governmental codes requiring certain physical clearances from the ground and other objects. For example, transmission lines must be a certain height above the ground to ensure safe operation. In the design of a transmission line factors such as tension of the line, ambient weather conditions, and anticipated electrical loads are used to insure compliance with the clearances dictated by code. Since most transmission lines are not regularly monitored, the design of these lines typically includes conservative assumptions. For example, the design capacity or electrical load of the line will be lower than the line could actually handle. As a result of these conservative designs, transmission lines typically have additional capacity that is not utilized. Further, the capacity of the line changes with weather conditions, which obviously vary over time.

This additional capacity in existing lines could be utilized, and new transmission lines would be less conservatively designed, if the physical location of the transmission line were regularly monitored to compliance with code clearances during operation. By monitoring the transmission line, its horizontal displacement and vertical displacement or sag from an initial position, can be known. In addition, other aspects regarding the physical condition of the transmission line can be observed, such as ice build-up on the line. Further still, known relationships between the sag of a transmission line or conductor and its operating temperature could be utilized to track or predict the life expectancy of the transmission line or conductor.

Based on the foregoing, there is a need for a device that monitors the physical location and condition of a transmission line that is able to report such information to a remote location as frequently as desired.

SUMMARY OF THE INVENTION

In one embodiment the present invention provides a device for monitoring a cable, comprising an imaging device having a field of view; a target, distinguishable within the field of view of the imaging device, associated with a cable; and a computer processor connected to the imaging device for analyzing images of the target produced by the imaging device to determine a position of the cable.

In another embodiment, the present invention provides a method for monitoring a cable, comprising calibrating a first image of a predetermined field of view showing a portion of a cable to be monitored; capturing a second image of the predetermined field of view; correlating the first image with the second image to determine a position of the portion of the cable within the second image; and reporting said position.

The present invention provides data regarding the physical location and condition of a monitored cable, or portion thereof, that can be either stored in a computer database or datalogger or transmitted to a remote location, thereby providing realtime information about the cable, or both. The present invention, therefore, provides the ability to remotely monitor any cable, including, for example, the sag of a transmission line or conductor, thereby allowing for use of additional capacity of that cable while ensuring safe operation.

Furthermore, knowledge of a transmission line's or conductor's sag from an initial position coupled with the known relationship between sag and the temperature of the conductor could also be used to determine the temperature at which the conductor is operating at any given time. Therefore, the present invention could also be used to monitor the amount of time a conductor is operated above a certain temperature to track the life expectancy of the conductor.

These and other embodiments and features of the invention will appear from the following description from which the preferred embodiments are set forth in detail in conjunction with the accompanying drawings.

DETAILED DESCRIPTION OF THE PREFERRED EMBODIMENTS

The structure and function of the preferred embodiments of the present invention can best be understood by reference to the drawings. The reader will note that where the same reference designations appear in multiple locations the numerals refer to the same or corresponding structure in those locations. In addition, it should be appreciated that while the following description is presented in the context of monitoring a transmission line, the present invention is capable of being used to monitor any type of cable, including transmission lines, distribution lines, conductors, telecommunications line, or any other object or structure, such as monitoring the movement of a bridge or mountain. As such, the term cable should be interpreted broadly to include any type of wire or cable and in the broadest sense to include any object or structure whose position or change in position is desired to be monitored.

Figure 1:
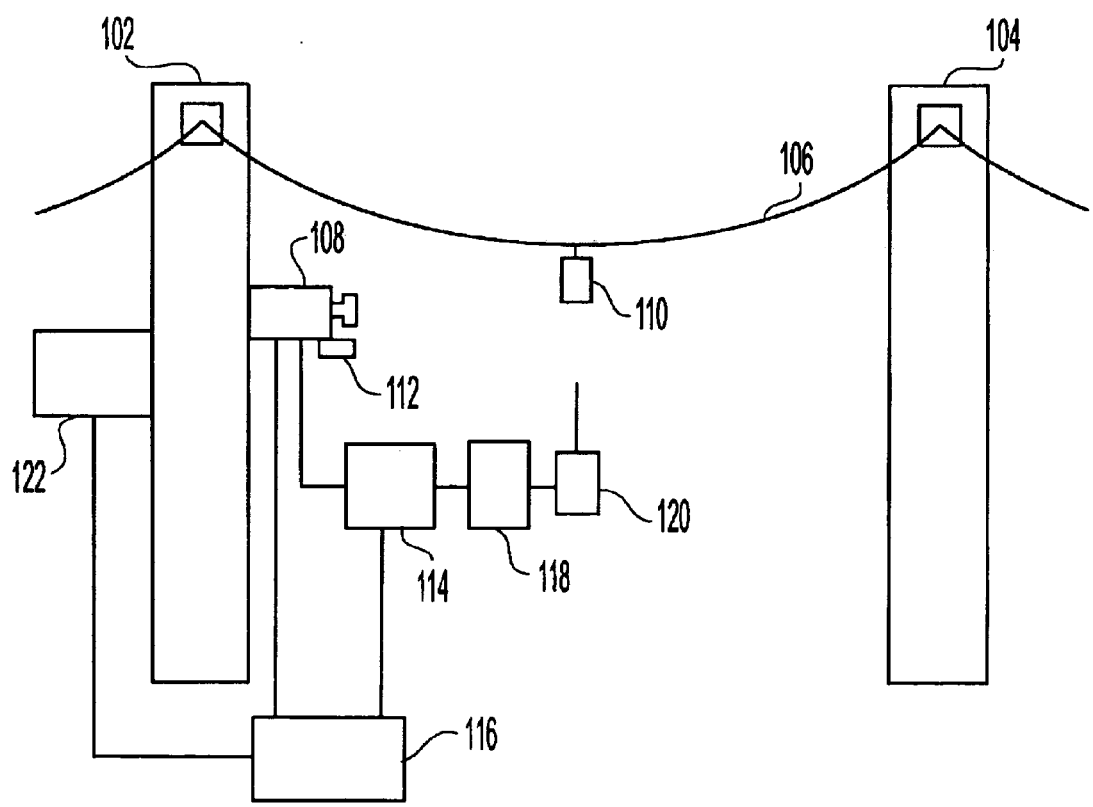
FIG. 1 shows a schematic view of a cable monitoring system according to one embodiment of the present invention.

FIG. 1 shows a schematic view of a cable monitoring system according to one embodiment of the present invention. Utility poles 102, 104 are used to hold a transmission line 106; however, it should be appreciated that the utility poles may be any structure capable of holding a transmission line or cable. An imaging device 108 is attached to one of the utility poles 102 in a position such that its field of view will include a portion or span of the transmission line 106 that is desired to be monitored. It should be appreciated that the position or location of the imaging device may be any fixed location that provides the desired field of view and does not have to be one of the poles to which the transmission line is attached. Further, it should be appreciated that the desired field of view includes the portion or length of the transmission line to be monitored. For example, any portion, length, or section of a particular transmission line may be selected for monitoring. Alternatively, an entire length of a transmission line may be monitored. However, the portion of the transmission line to be monitored should be selected based, in part, upon the size of the field of view and the depth of field provided by the particular imaging device used and, in particular, the capability of its lens. The field of view must also include a target 110 that is attached to the transmission line 106.

The imaging device 108 may be any device capable of capturing an image of the desired field of view. As noted above, the desired field of view includes that portion of the transmission line to be monitored and the target 110. As such, the imaging device 108 may be a still camera or a video camera, such as a charge coupled device (CCD) camera. The specifications of the selected imaging device 108 are selected based upon the desired field of view and the distance from the camera to the target. One of skill in the art would know, therefore, what lens size would be required to provide the desired field of view, resolution, and depth of view.

It is important, however, that the imaging device 108 be capable of capturing an image of the desired field of view upon demand, either manual or preprogrammed, or upon demand from a remote location. For example, it is important that the imaging device 108 be able to either be pre-programmed to collect the desired image at pre-determined times or be capable of receiving a signal that causes the imaging device 108 to collect the image, such as a signal from a computer processor. In addition, the imaging device 108 should be able to transmit the image collected to a computer processor, either automatically upon collection of the image or at pre-programmed times, or upon demand from the computer processor.

Specifically, for example, a COHU model 4942-2000 monochrome CCD camera with a 75-mm lens and an electronic iris may be used. In addition, a CCD camera having a resolution of 640×480 pixels may be used. In this instance, it is desirable to have the camera oriented such that the 640 pixel side corresponds to the vertical side of the image.

The target 110 is any object that provides a unique pattern within the field of view and that can be associated with the portion or span of the transmission line 106 to be monitored. As such, the target 110 must be capable of being distinguished within the field of view and the image captured by the imaging device 108, since it is the target that is used in the image processing to determine the position of the transmission line 106 and any changes to that position. Therefore, it should be appreciated that the target 110 should be positioned as close as possible to the particular portion of the transmission line to be monitored. Otherwise, the movement of the target 110 may not be as representative of the movement or position of a particular portion of the transmission line.

In cases where a long span of transmission line is to be monitored, the target may be placed at a convenient distance away from the camera, and the known catenary of the line along with the ground profile can be used to calculate the ground clearance or sag at any other point on the span of the transmission line. On long transmission lines, multiple systems such as that described in connection with FIG. 1 may be installed on more than one span to better monitor the overall position of the line.

It is also feasible to place multiple targets on the same span or adjacent spans, as long as they are in the field of view of the imaging device, and monitor the transmission line or adjacent lines at each of the target locations using a single imaging device. Each of the targets may need to have a distinctive pattern if they are fairly close to each other. Otherwise, they may have the same pattern, and the portion of the field of view searched for each target could be limited such that chances of having two targets in the same search area is reduced.

Generally, the target may be directly connected to the transmission line so that the target is clearly within the field of view of the imaging device. To be distinguishable within the image captured by the imaging device the target may contain a reflective surface or unique pattern to distinguish the target from the background within the field of view. One of skill in the art will appreciate how to construct a unique pattern for the target. For example, the reflective surface may be provided by the use of retro-reflective tape or any other type of reflective coating. A unique pattern may be placed on the target by painting or also by the attachment of retro-reflective tape. In a preferred embodiment, the target may contain self-illuminating diodes that are inductively powered from the current flowing through the transmission line or conductor using induction coils within the target housing or by a battery within the target housing. These illuminated diodes form an easily recognized pattern that is also easily distinguished within the captured image. In another preferred embodiment, the target may be illuminated using an illuminator, such as diode lasers or light emitting diode illuminators, that are mounted near the imaging device and directed to the target. Referring to FIG. 1 an illuminating device 112 is shown that illuminates the target 110. Illumination of the target is particularly preferred when the imaging device captures images during levels of low light, for example, during periods of cloud-cover or nighttime.

Since the target must be distinguished within the field of view during image processing, the dimensions of the target are dependent upon the size of the field of view and the distance between the imaging device and the target. One of skill in the art will understand how to appropriately size the target so that the selected image processing software will be able to recognize and distinguish the target. It is desirable to keep the target size as small as possible to avoid any corona effects and to minimize the visibility of the target to the public to avoid vandalism of the target. In a preferred embodiment, the target is approximately 9 inches by 10 inches, for a camera to target distance of approximately 150 feet and a 75 mm lens. In addition, the target may be made of rubber, garolite, delrin, or other similarly durable material. Preferably, the material used should be weatherized, and non-conductive and may be made from a polymer material that provides some flexibility in the event of any impact received by the target, such as from vandalism.

The target may be attached to the portion or span of the transmission line being monitored using a hotline clamp or other device known in the art, that allows attachment of the target while the transmission line is energized or in use. However, it should be appreciated that the target may be attached while the transmission line or conductor is not energized. As such, the target must be capable of being connected to the transmission line so that it remains in the same position during operation.

Figure 2:
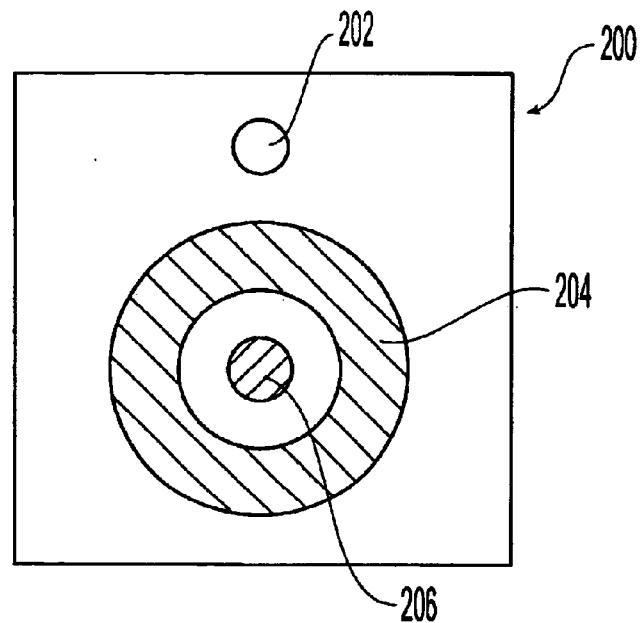
FIG. 2 is plan view of one embodiment of a target for use in the present invention.

FIG. 2 is plan view of one embodiment of a target for use in the present invention. FIG. 2 shows a target 200 that attaches to a hot line clamp through a hole 202 in the target. The hot line clamp is then attached to the transmission line at the desired location. In addition, the target 200 has circular patterns 204, 206 formed using retro-reflective tape to provide a more easily distinguishable target. For use during low visibility and nighttime, an illuminator mounted near the imaging device may be used to illuminate the retro-reflective tape. It should be appreciated that additional circular patterns or completely different patterns may be used.

Figure 3:
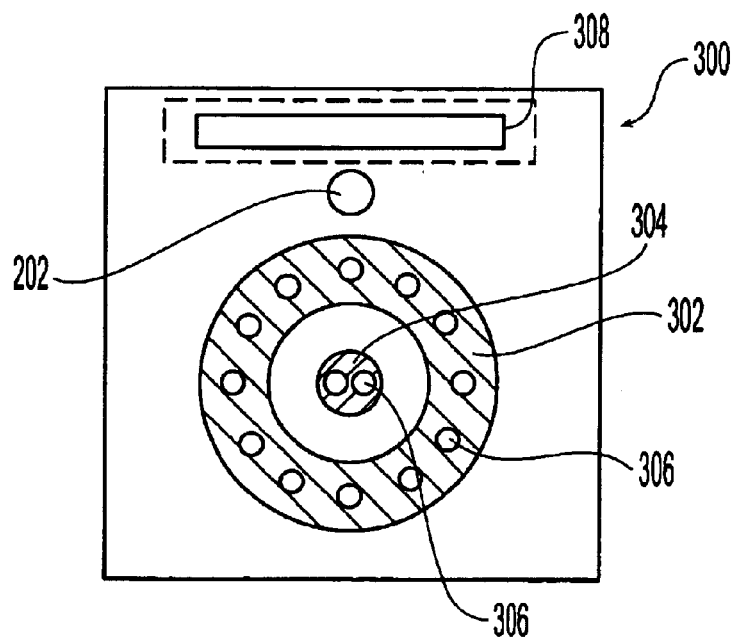
FIG. 3 is plan view of another embodiment of a target for use in the present invention.

FIG. 3 is plan view of another embodiment of a target for use in the present invention. FIG. 3 shows a target 300 that has circular patterns 302, 304 and multiple light emitting diodes 306 within each retro-reflective circular pattern 302, 304 that are used to illuminate those patterns 302, 304 in the target 300. In addition, the target 300 has embedded induction coils 308 that are used to power the diodes. It should be appreciated that the use of multiple light emitting diodes offers redundancy in case some of them fail. It should also be noted that the use of circular pattern or any other symmetric pattern in the target makes the target appear the same to the imaging device even if the target rotates about an axis perpendicular to the target's surface due to wind or any other reason.

It should be appreciated that, optionally, the transmission line, specifically that portion or span that is being monitoring, may inherently serve as the target. Moreover, a specific sub-portion of that portion being monitored may serve as the target. In these cases, the portion serving as the target must be distinguishable by the image processing software from the remainder of the image within the field of view.

Referring back to FIG. 1, the imaging device 108 is connected to a computer processor 114 that receives the images collected by the imaging device 108 and analyzes those images to determine movement or changes in position of the portion of the transmission line 106 that is being monitored. The computer processor 114 may be any computer microprocessor or microchip capable of receiving either an analog or digital image collected by the imaging device 108. More specifically, the computer processor 114 may be capable of receiving the image collected by the imaging device 108 either electrically or optically. In the case where the image received is an analog signal from the imaging device 108, the computer processor 114 must be capable of converting that image into a digital form for subsequent analysis, for example, by using a frame grabber. In addition, the computer processor 114 must be capable of image processing tasks by using image processing firmware or software. Commercially available image processing software, such as IMAQ Vision, available from National Instruments, may be used to perform the image processing tasks.

In one embodiment a 350 MHz Pentium II desktop computer equipped with a video capture board (e.g., PCI-1408 available from National Instruments) and IMAQ Vision software can be used for data collection and processing. Graphical user interfaces may be written, using, for example, LabVIEW available from National Instruments, and used to integrate the process of capturing and processing of the images collected and calculating the position of the transmission line being monitored.

In a preferred embodiment, instead of using a desktop computer, a single board computer equipped with a frame grabber card can be used. Firmware implementing the image capture and processing tasks are used to calculate the position of the transmission line being monitored. The firmware implements a template matching image-processing routine to locate the target in the captured image. Specifically, the template matching routine used is a cross-correlation routine similar to routines available in commercial software like National Instruments' IMAQ Vision software. The firmware may be written using C++ programming language to run under the DOS operating system, thereby eliminating the need for a Windows operating system, which is needed for any graphical user interface.

In a particularly preferred embodiment, the imaging device 108 and the computer processor 114 are a single device, such as a smart vision system. In this embodiment, the smart vision system comprises a monochrome CCD imager with direct memory image acquisition and built-in computer processor that can be programmed to perform image processing tasks. In this case, the image is read directly into the memory in digital form for the processor to perform the requisite image processing.

The imaging device 108 and the computer processor 114 are connected to a power source 116 that supplies the required power to operate the imaging device 108 and the computer processor 114. In one embodiment, the power source 116 may be simply an AC power source, e.g. 115 VAC. In this case 115 VAC is fed through a breaker/disconnect box and then through a surge arrester prior to being fed to the imaging device or the computer processor. AC-to-DC converters and DC-to-DC converters can be used to obtain different voltages as required. In another embodiment, the power source 116 may be a battery, e.g. 12 VDC. This battery may optionally be a rechargeable battery, which may alternatively be recharged using solar power collected by a solar panel or solar cell array 122, that has the necessary photovoltaic cells and circuitry, or by other means known in the art, in those situations where AC power is not available.

The computer processor 114 may optionally be connected to a data storage device 118 for storing the results of the analysis made by the computer processor 114 for later retrieval and use. The data storage device may be any device capable of storing computer data, such as a hard disk drive, a datalogger, or other format known in the art.

The data storage device 118 may optionally be connected to a communications transmitter 120 for sending the results of the analysis made by the computer processor 114 to a remote location. It should be appreciated that the data storage device 118 and the communications transmitter 120 may also be connected to the power source 116 if necessary. The communication transmitter could be a phone line, cell phone, radio, satellite link, or other means known in the art for such transmission.

Figure 4:
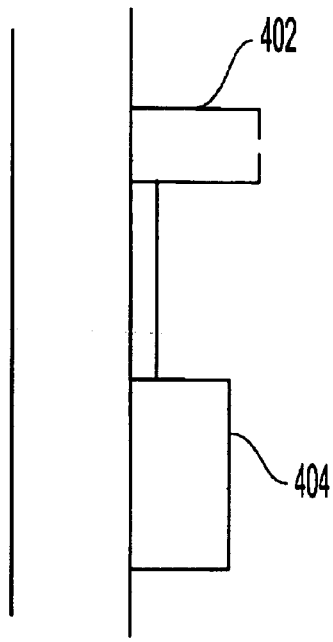
FIG. 4 shows housing for use with one embodiment of the present invention.

FIG. 4 shows a housing for use with one embodiment of the present invention. In this embodiment the imaging device and the illuminator that is used to illuminate the target are housed in a weatherized housing 402 to protect the imaging device and the illuminator, if used, from deleterious weather. The power source may also be housed in a weatherized housing 404. In one embodiment, a nitrogen pressurized housing may be used to house the imaging device. Alternatively, the imaging device, illuminator, if any, computer processor, communications transmitter, and power source may all be housed together or separately or in any combination within a weatherized housing.

Figure 5:
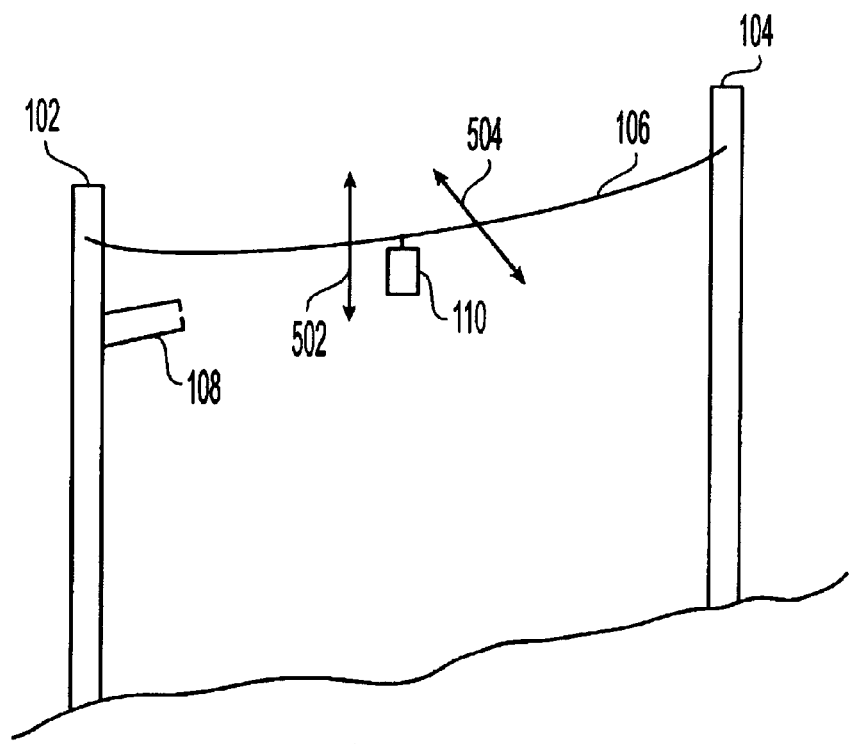
FIG. 5 shows a perspective view of one embodiment of the present invention to illustrate the general operation of the method for monitoring a cable.

FIG. 5 shows a perspective view of one embodiment of the present invention to illustrate the general operation of the method for monitoring a transmission line. FIG. 5 shows the transmission line to be monitored 106 and the imaging device 108 that is positioned to capture a field of view that includes that portion or span of the transmission line to be monitored and the target 110. Generally, the present invention provides a method for determining the initial location of that portion or span of a transmission line 106 to be monitored in both a vertical direction 502 relative to the ground and in a horizontal direction 504 and changes to that initial location at a future point in time.

It should be appreciated that prior to operation of the method of the present invention, the transmission line monitoring system must be physically installed or positioned. As described above, the transmission line monitoring system includes an imaging device, a computer processor having the requisite firmware or software for analyzing images collected, a target positioned on the portion of the transmission line to be monitored, a power source, and, optionally, an illuminator, a data storage device, and a communications transmitter. The installation process includes attaching the target to the desired portion of the transmission line to be monitored and installing the imaging device to a fixed location such that the field of view of the imaging device includes the target and as much of the transmission line as desired. It should be appreciated that the imaging device may be oriented in a normal position such that the field of view is such that the ground is at the bottom of the image, or, alternatively, the imaging device may be oriented to provide a field of view that allows for larger changes in position of the target without losing sight of the target within the field of view. For example, if the portion of the transmission line being monitored appears to move more in the up and down direction, then, depending upon the aspect ratio of the image, the imaging device may be placed on its side to provide more range in the vertical direction in the field of view. One of skill in the art will appreciate that the connections between the imaging device and the other parts of the monitoring system may be accomplished as appropriate. In addition, a calibration device is positioned within the field of view of the imaging device that has marked gradations showing known distances. As will be discussed below, the calibration device is used to correlate distances in the collected images, which are measured in pixels, with actual distances. The calibration device may, for example, be a stick that has known distances marked along its axis that is then positioned in any suitable manner within the field of view but at the same distance from the imaging device as the target. Preferably, the calibration device is positioned next to the target mounted on the line. It should be appreciated that the calibration device is only necessary during calibration and is not needed during subsequent operation.

Figure 6:
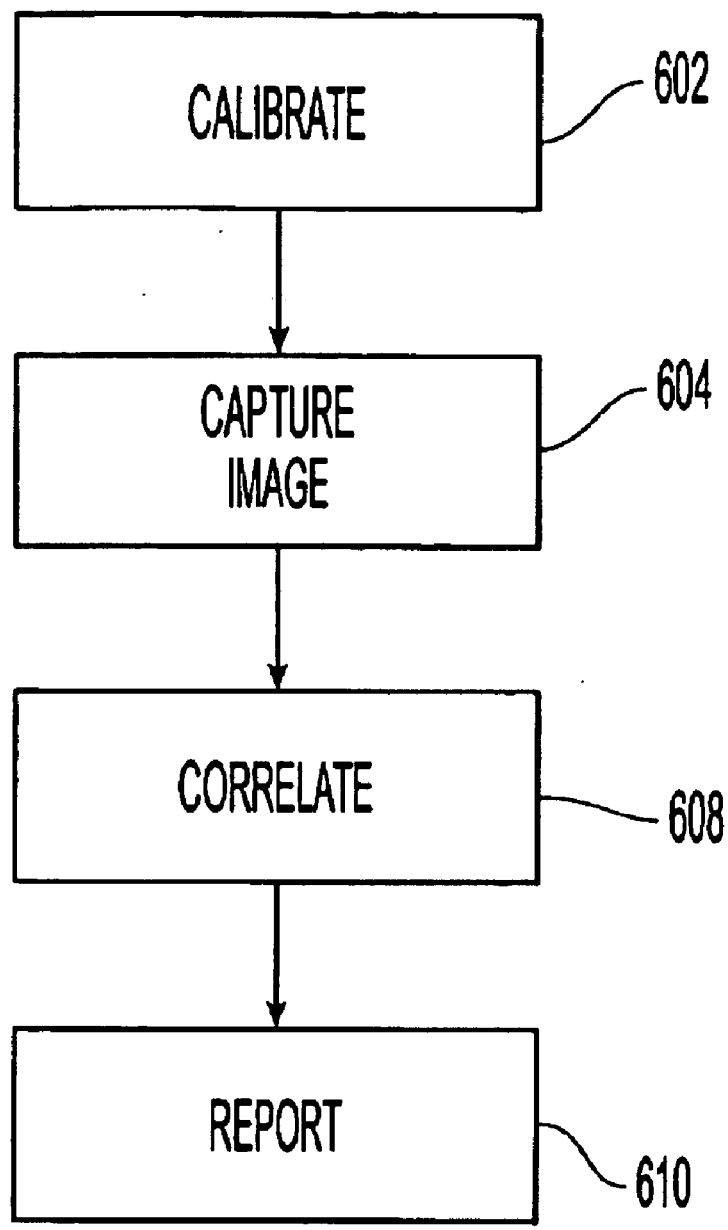
FIG. 6 shows a flow diagram of the method according to one embodiment of the present invention.

FIG. 6 shows a flow diagram of the method according to one embodiment of the present invention. In the step 602, calibration of the transmission line monitoring device is performed. Generally, the calibration is performed to determine an initial location of the portion of the transmission line to be monitored. The initial location basically consists of knowing the coordinates or location of the target within an initial image taken by the imaging device from which the actual physical location of the transmission line may be determined. More specifically, the calibration step provides vertical and horizontal offset values that are subsequently used to calculate the actual ground clearance and horizontal location of the portion of the transmission line being monitored at this initial point in time and at a later point in time.

Figure 7:
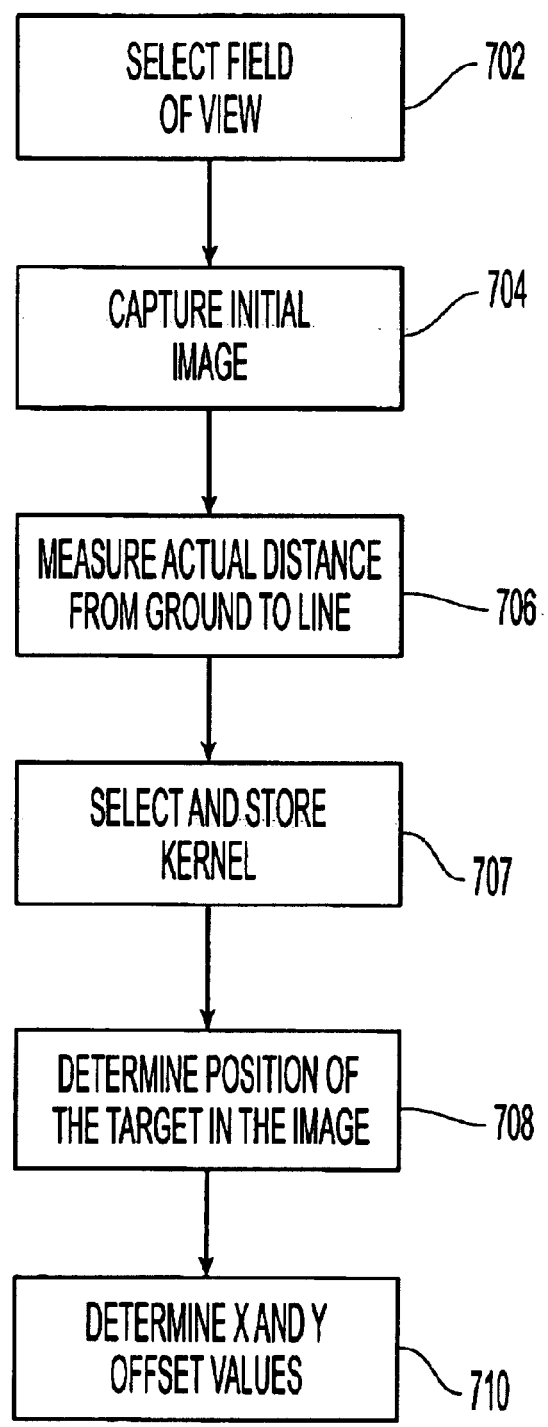
FIG. 7 shows a flow diagram for calibrating a cable monitor system according to one embodiment of the invention.

FIG. 7 shows a flow diagram for calibrating a cable monitoring system according to one embodiment of the invention. As noted, the calibration step 602 provides the physical location of the transmission line at an initial time. Specifically, the distance from the transmission line to the ground is determined, thereby providing the ground clearance or sag of the transmission line at the point along the transmission line where the target has been positioned, as well as a horizontal location at that same point relative to a fixed object within the field of view or simply relative to the vertical edge of the image.

In one embodiment, the vertical and horizontal locations are determined as follows. In the step 702, a predetermined field of view is selected for the imaging device that includes the target that is associated with a portion of the transmission line to be monitored. As noted previously, it should be appreciated that preferably the target is distinguishable from the surrounding background within the field of view. In addition, the field of view should include a calibration device that is fixedly positioned and shows known distances marked along its axis In the step 704, an initial image is collected by the imaging device for the predetermined field of view. As noted above, the target may include self illuminating diodes or an illumination device positioned next to the imaging device and directed at the target may be used. In these cases, the target is illuminated prior to capturing the initial image.

In the step 706, the actual distance from the ground to the transmission line, or actual ground clearance value, is measured. This can be accomplished manually, using, for example, the same calibration device used to provide actual distances in the images taken of the field of view or by surveying techniques known in the art. Since this value will later be used to determine the ground clearance or sag of the portion of the transmission line to be monitored, it is preferable to measure this value as close in time as possible to capturing the initial image, so that the actual ground clearance value is the same as that present in the initial image. It should be appreciated that the step 706 is not required if only the change in sag is being monitored as opposed to the actual ground clearance value.

In the step 707, a kernel, or defined region of pixels, within the image that contains the target is selected by the user and stored by the computer processor in its associated computer memory. In one embodiment, the kernel is defined by selecting a portion of an image previously collected that contains the target at the same distance from the imaging device with the same lens. In this manner the kernel is pre-defined without use of the initial image.

It should be appreciated that the kernel may also be selected directly from the initial image. In this case, a user viewing the initial image may select a portion of that image to serve as the kernel. This selected kernel is then stored in computer memory for later use in locating the kernel or target within subsequently collected images. (It should also be appreciated that the selected kernel preferably has an even number of pixels in the horizontal direction to avoid a suspected software bug in IMAQ Vision software, version 4.4.)

In the step 708, the position of the target is determined within the initial image. Specifically, a two-dimensional cross-correlation algorithm is used to determine where the kernel is within the initial image. This is accomplished by comparing the selected kernel to the initial image to determine the position of the kernel within the image. From this information, the x,y coordinates within the initial image of the kernel and, therefore, the target can be determined. More specifically, the two-dimensional cross-correlation algorithm consists of comparing the selected kernel, which is stored as a TIFF, raw, or any other format image file in the computer processor, to the initial image. This comparison is generally done by comparing the intensity of the set of pixels comprising the kernel to the intensity of a similar set of pixels within the image. More specifically, a set of intensity values may be assigned to each pixel within the kernel and the image and a comparison performed until a match is made, thereby identifying the location of the kernel within the image. In a preferred embodiment, a gray scale or gray value is used for the intensity. For example, this comparison is accomplished by assigning a gray value from 0–255 to each pixel within the kernel and to each pixel of a digital form of the image, where 0 corresponds to black and 255 corresponds to white. The set of gray values assigned to the kernel are then compared to equivalent sets of gray values from the image until the kernel is located within the image. Of course, this comparison may not be perfect, so a correlation coefficient is given that ranges from 0–1 and is reflective of the degree of matching found between the set of gray values representing the kernel and those from the image. The center pixel within the kernel is then used to provide the x,y coordinates of the kernel within the image. These coordinates serve as the initial position of the target and the portion of the transmission line to be monitored. It should be appreciated that where the user selected the kernel from the initial image itself that the x,y coordinates of the kernel may be obtained in the same manner but without having to locate the kernel using the two-dimensional cross-correlation algorithm. It should be appreciated that other template matching techniques, such as least squares, may be used to locate the target within the image. Also, these same techniques may be used with color images, and images could be stored in raw, compressed, or other commonly used image formats. located within the image. Of course, this comparison may not be perfect, so a correlation coefficient is given that ranges from 0–1 and is reflective of the degree of matching found between the set of gray values representing the kernel and those from the image. The center pixel within the kernel is then used to provide the x,y coordinates of the kernel within the image. These coordinates serve as the initial position of the target and the portion of the transmission line to be monitored. It should be appreciated that where the user selected the kernel from the initial image itself that the x,y coordinates of the kernel may be obtained in the same manner but without having to locate the kernel using the two-dimensional cross-correlation algorithm. It should be appreciated that other template matching techniques, asuch as least squares, may be used to locate the target within the image. Also, these same techniques may be used with color images, and images could be stored in raw, compressed, or other commonly used image formats.

Figure 8:
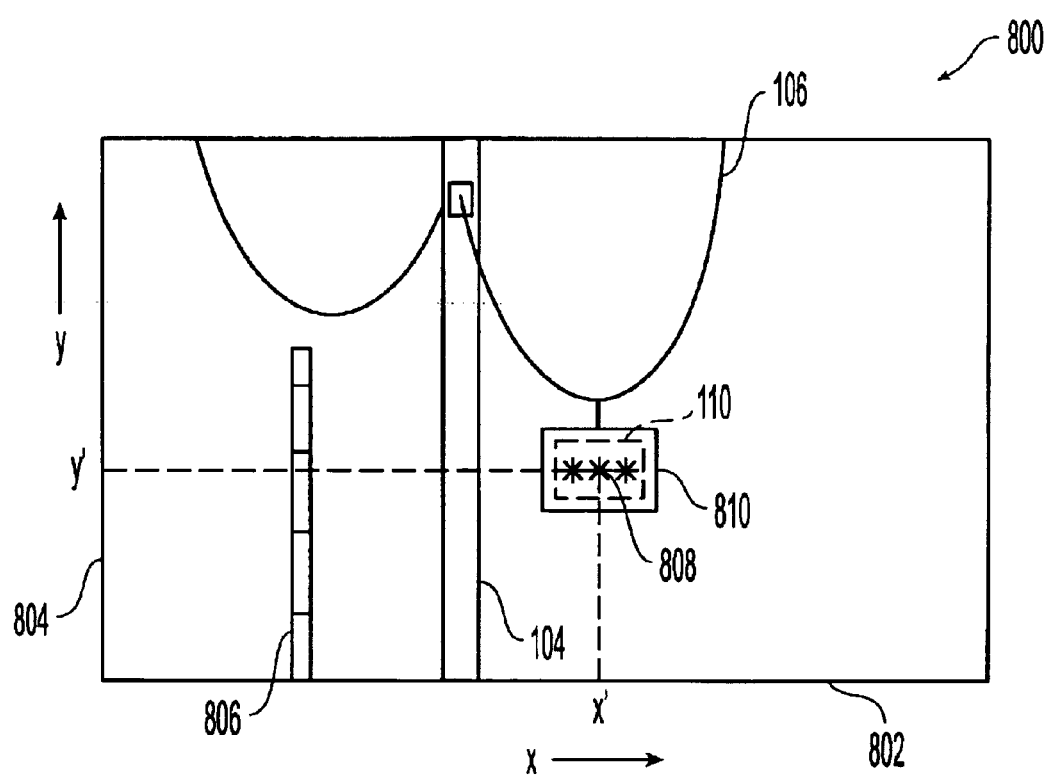
FIG. 8 shows an image and its field of view according to one embodiment of the present invention to illustrate the position of the kernel within an image.

FIG. 8 shows an image and its field of view according to one embodiment of the present invention to illustrate the position of the kernel within an image. The horizontal boundary 802 of the image 800 represents the x axis, and the vertical boundary 804 of the image 800 represents the y axis. Also shown is the transmission line to be monitored 106, the calibration device 806, the target 110 and its illuminated diodes 808, and the kernel 810. As shown, the x,y coordinates of the kernel are x' and y', referred to as the x,y pixel coordinates.

Referring back to FIG. 7, in the step 710, a vertical offset value is calculated based on the y coordinate of the kernel, the actual ground clearance value (i.e., the distance from the ground to the line), and the calibration device, which provides a conversion factor defined as the number of pixels per actual unit of distance, such as feet, in the image.

The number of pixels per actual unit of distance is readily determined by counting the number of pixels in the image between the gradations on the calibration devices. Alternatively, this conversion factor could be determined without the calibration device and calculated from the characteristics of the imaging device and distance from the imaging device to the target. Also, the known size of the target could be used to determine the conversion factor rather than using a separate calibration device. It should be appreciated that the conversion factor is a function of the size of the CCD sensor in the imaging device, the angle of view of the lens, and distance between the imaging device and the target or the point of measurement.

In addition, in the step 710 a horizontal offset value is also calculated based on the x coordinate of the kernel and the calibration device. Specifically, the vertical offset value Y is calculated as follows:

$Y(ft)$=Actual ground clearance value−($y$ pixel coordinate/number of pixels/ft).

The horizontal offset value X is calculated as follows:

$X(ft)=x$ pixel coordinate/number of pixels/ft.

Referring back to FIG. 6, in the step 604, the imaging device captures an image of the transmission line using substantially the same field of view as used in the calibration step 602 at a later point in time. As described previously, the capturing of images later in time may be initiated manually or pre-programmed. In addition, each image, once digitized, may be stored in the data storage device for later use. It may also be possible to transmit any of the stored images to a remote location or computer by using the communications transmitter.

In the step 608 this later captured image is then correlated to the selected kernel. This is accomplished in the same way described above using the two-dimensional cross-correlation algorithm. Therefore, the intensity values assigned to the pixels comprising the selected kernel are compared to an assigned set of color intensity values for the captured image. It should be appreciated that a preferred embodiment for assigning the intensity values is the use of gray values between 0–255, as described in connection with the initial image processing in FIG. 7. Once a match is made between the kernel and a portion of the image, which should be the present position of the kernel (or the position of the kernel and the target at the time the image was captured), the x,y coordinates of the present position of the kernel are determined. Again, these coordinates are determined in the same manner described in connection with determining the initial position of the kernel. Once the present x,y coordinates are determined the actual ground clearance and horizontal position may be determined. The ground clearance or sag is determined as follows:

Ground Clearance (ft)=($y$ pixel coordinate/number of pixels/ft)+$Y$ where the number of pixels/ft is the value determined from the calibration device and Y is the vertical offset value. The horizontal position is determined as follows:

Horizontal Location (ft)=$x$ pixel coordinate/number of pixels/ft.−$X$ where the number of pixels/ft is the value determined from the calibration device and X is the horizontal offset value.

It should be appreciated that alternatively, the user may manually identify the kernel for the computer processor for each image collected, rather than using the two-dimensional cross-correlation algorithm. In this instance, however, the user must interact with the computer processor to obtain the ground clearance and horizontal position values, since these would not be automatically calculated without identification of the kernel in the latest captured image. However, it is also possible to utilize the stored images to later review the efficiency with which the computer processor identified the kernel within each image.

In the step 610, the ground clearance and horizontal positions are reported. This reporting step may consist of simply reporting the x,y coordinates or the determined ground clearance or sag and horizontal position to a data storage device. In a more preferred embodiment, the reporting step includes reporting the determined sag and horizontal position to a remote location using a communications transmitter, such as a cellular phone or radio. Such communications transmitter could transmit the desired information to a remote location and may be received by a cellular phone, radio, or computer device. Alternatively, a remote location could contact the communications transmitter to query the data storage device to obtain any desired information.

It should be appreciated that in a preferred embodiment, a time stamp that is collected at the time a given image is captured may also be stored and reported. This enables the position of the transmission line to be monitored over time and changes in its position may be correlated with time to determine any trends in its movement.

It should be appreciated that although the invention has been described in terms of determining both the vertical and horizontal location of the transmission line, that in an alternative embodiment, it is possible to only provide a vertical position or sag or only a horizontal position. In either case, the same processing steps would be required, except for the coordinate that is not desired.

Various embodiments of the invention have been described. The descriptions are intended to be illustrative of the present invention. It will be apparent to one of skill in the art that modifications may be made to the invention as described without departing from the scope of the claims set out below. For example, it is to be understood that although the invention has been described using as an example a transmission line, any object may be monitored by the present invention. Furthermore, it should be appreciated that the invention can provide either actual physical positions for the cable being monitored or changes in those positions over time.

While the foregoing description and drawings represent the preferred embodiments of the present invention, it will be understood that various additions, modifications and substitutions may be made therein without departing from the spirit and scope of the present invention as defined in the accompanying claims. In particular, it will be clear to those skilled in the art that the present invention may be embodied in other specific forms, structures, arrangements, proportions, and with other elements, materials, and components, without departing from the spirit or essential characteristics thereof. The presently disclosed embodiments are therefore to be considered in all respects as illustrative and not restrictive, the scope of the invention being indicated by the appended claims, and not limited to the foregoing description.

What is claimed is:

1. A device for monitoring a cable, comprising:

an imaging device having a field of view;

a target, distinguishable within said field of view of said imaging device, associated with a cable; and a computer processor connected to said imaging device for analyzing images of said target produced by said imaging device to determine a position of said cable.

2. The device of claim 1, where said imaging device comprises a charge coupled device camera.

3. The device of claim 1, where said imaging device comprises a still camera.

4. The device of claim 1, wherein said target comprises a reflective surface.

5. The device of claim 4, wherein said reflective surface comprises retro-reflective tape.

6. The device of claim 1, wherein said target comprises a portion of said cable.

7. The device of claim 1, wherein said target is self-illuminating.

8. The device of claim 1, wherein said computer processor comprises a frame grabber.

9. The device of claim 1, wherein said computer processor is electrically connected to said imaging device.

10. The device of claim 1, wherein said computer processor is optically connected to said imaging device.

11. The device of claim 1, further comprising an illuminator mounted in proximity to said imaging device.

12. The device of claim 11, wherein said illuminator comprises a laser diode.

13. The device of claim 11, wherein said illuminator comprises a plurality of light emitting diodes.

14. The device of claim 1, further comprising a data storage device connected to said computer processor for storing said position.

15. The device of claim 14, further comprising a communications transmitter connected to said data storage device for sending said data to a remote location.

16. The device of claim 1, further comprising a photovoltaic power source electrically connected to said imaging device.

17. The device of claim 1, further comprising a nitrogen pressurized housing that contains said imaging device and said computer processor.

18. The device of claim 1, wherein said imaging device and said computer processor comprise a smart vision system.

19. A device for monitoring a cable, comprising:

a sealed housing having a viewing port;

a video camera mounted within said sealed housing and having a field of view through said viewing port;

a target, distinguishable within said field of view of said video camera, mounted on a cable having a position;

a computer processor mounted within said housing and connected to said video camera for analyzing video images of said target produced by said video camera to determine a change in said position;

a data storage device mounted within said housing and electrically connected to said computer processor for storing said position determined by said computer processor and a time value associated with said position; and a communications transmitter electrically connected to said data storage device for transmitting said position and said time value to a remote location.

20. A method for monitoring a cable, comprising:
  calibrating a first image of a predetermined field of view showing a portion of a cable to be monitored;
  capturing a second image of said predetermined field of view;
  correlating said first image with said second image to determine a position of said portion of said cable within said second image; and
  reporting said position.

21. The method of claim 20, wherein said calibrating step produces a vertical offset value, wherein said position comprises a cable sag, and wherein said correlating step
  comprises comparing said first image with said second image to determine a location of said portion of said cable within said second image and calculating said cable sag based upon said location of said portion of said cable within said second image and said vertical offset value.

22. The method of claim 21, wherein said calibrating step comprises the steps of:
  selecting said predetermined field of view comprising a target associated with said portion of said cable and a calibration device;
  capturing said first video image of said predetermined field of view;
  determining a conversion factor for a number of pixels per an actual unit of distance in said first video image;
  determining a y-pixel coordinate for said target within said first video image;
  measuring an actual ground clearance value between said target in said first video image and a ground position;
  calculating said vertical offset value based on said conversion factor, said y-pixel coordinate and said actual ground clearance value.

23. The method of claim 20, wherein said predetermined field of view comprises a target associated with said portion of said cable.

24. The method of claim 23, further comprising the step of illuminating said target prior to said capturing step.

25. The method of claim 20, wherein said correlating step comprises:
  defining a predetermined portion of said first image containing a target associated with said portion of said cable;
  assigning a first set of intensity values to each pixel in said predetermined portion depending upon its shade;
  determining x-y pixel coordinates of said target within said first image;
  assigning a second set of intensity values to each pixel in said second image depending upon its shade;
  comparing said first set of intensity values to said second set of intensity values to identify a position of said predetermined portion within said second image; and
  determining x-y pixel coordinates for said target within said second image, thereby determining said location of said portion of said cable within said second image.

26. The method of claim 25, further comprising calculating a correlation coefficient based upon said comparing step.

27. The method of claim 20, wherein said reporting step comprises:
  storing said position and an associated time value; and
  transmitting said position.

28. The method of claim 27, wherein said transmitting step comprises transmitting said position by radio waves.

29. The method of claim 27, wherein said transmitting step comprises transmitting said position by a cellular phone.

30. The method of claim 20, wherein said calibrating step further comprises producing a horizontal offset value, wherein said position comprises a horizontal position, and wherein said calculating step comprises comparing said first image with said second image to determine a location of said portion of said cable within said second image and calculating a horizontal position based upon said location of said portion of said cable within said second image and said horizontal offset value.

31. A device for monitoring a cable, comprising:
  a stationary imaging device having a field of view;
  a target, distinguishable within said field of view of said stationary imaging device, fixedly attached to a cable; and
  a computer processor connected to said stationary imaging device for analyzing images of said target produced by said stationary imaging device to determine a position of said cable relative to a previous position of said cable.

32. The device of claim 31, wherein said target comprises a reflective surface.

33. The device of claim 32, wherein said reflective surface comprises retro-reflective tape.

34. The device of claim 31, wherein said target is self-illuminating.

35. The device of claim 31, further comprising an illuminator mounted in proximity to said stationary imaging device.

36. The device of claim 35, wherein said illuminator comprises a laser diode.

37. The device of claim 35, wherein said illuminator comprises a plurality of light emitting diodes.

38. The device of claim 31, further comprising:
  a data storage device connected to said computer processor for storing said position; and
  a communications transmitter connected to said data storage device for sending said data to a remote location.

39. The device of claim 31, further comprising a photovoltaic power source electrically connected to said stationary imaging device.

40. The device of claim 31, further comprising a nitrogen pressurized housing that contains said stationary imaging device and said computer processor.

41. The device of claim 31, wherein said stationary imaging device and said computer processor comprise a smart vision system.

* * * * *